(12) United States Patent
Chang

(10) Patent No.: US 6,731,125 B2
(45) Date of Patent: *May 4, 2004

(54) MULTI-CHANNEL SEMICONDUCTOR TEST SYSTEM

(75) Inventor: Kou-Yung Chang, Changhua Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/861,147

(22) Filed: May 18, 2001

(65) Prior Publication Data

US 2002/0130678 A1 Sep. 19, 2002

(30) Foreign Application Priority Data

Mar. 14, 2001 (TW) ........................................ 90105924 A

(51) Int. Cl.$^7$ ................................................ G01R 31/02
(52) U.S. Cl. ..................................... 324/765; 324/158.1
(58) Field of Search ................................. 324/765, 754, 324/755, 158.1, 72.5, 759, 73.1; 438/48; 257/14, 16, 17, 18, 48; 365/201; 714/719, 724, 736, 737, 735; 371/50; 702/711

(56) References Cited

U.S. PATENT DOCUMENTS

| | | | | |
|---|---|---|---|---|
| 2,984,828 | A | * | 5/1961 | Gridley et al. .......... 340/870.22 |
| 3,319,231 | A | * | 5/1967 | Oliver .......................... 710/72 |
| 4,201,976 | A | * | 5/1980 | Patel .......................... 714/804 |
| 5,794,175 | A | * | 8/1998 | Conner ....................... 702/119 |
| 6,078,188 | A | * | 6/2000 | Bannai et al. ............... 324/765 |
| 6,389,525 | B1 | * | 5/2002 | Reichert et al. ............. 711/217 |
| 6,452,411 | B1 | * | 9/2002 | Miller et al. ................ 324/765 |
| 6,499,121 | B1 | * | 12/2002 | Roy et al. .................... 714/724 |
| 6,541,791 | B2 | * | 4/2003 | Chang ........................ 257/48 |

* cited by examiner

Primary Examiner—David A Zarneke
Assistant Examiner—Jimmy Nguyen
(74) Attorney, Agent, or Firm—Ladas & Parry

(57) ABSTRACT

The present invention provides a multi-channel semiconductor test system comprising: a handler, a code generator, a testing device and a differentiator. The handler has a plurality of channels for testing a plurality of dies. The code generator generates a plurality of codes corresponding to the channels for the dies. The testing device tests the dies, derives and transfers a plurality of testing results of and together with the corresponding codes for the dies. The differentiator receives the testing results and the codes, and transfers the testing results to the handler through corresponding channels according to the codes.

10 Claims, 4 Drawing Sheets

MULTI-CHANNEL SEMICONDUCTOR TEST SYSTEM

BACKGROUND OF THE INVENTION

1. Field of the Invention

The present invention relates to a multi-channel semiconductor test system and particularly to a multi-channel semiconductor test system capable of differentiating channels of a handler for corresponding dies during testing.

2. Description of the Prior Art

FIG. 1 is a block diagram of a conventional multi-channel semiconductor test system. The system comprises a handler 1, a testing device 2 and an interface 3.

The handler 1 comprises an accepter 13, which accepts a wafer (not shown) having three dies 11a, 11b and 11c to be tested. A display 14 in the handler 1 displays test results of the dies 11a, lib and 11c read by the handler 1 through channels 15a, 15b and 15c.

The testing device 2 comprises three testers 22a, 22b, and 22c, and three test modules 21a, 21b, and 21c, corresponding to the dies 11a, 11b and 11c, respectively. The testers 22a, 22b and 22c control the test modules 21a, 21b and 21c to generate three groups of test signals to the dies 11a, 11b and 11c through buses L1, L2 and L3, respectively. Then, the test modules 21a, 21b and 21c derive three groups of testing results through the buses L1, L2 and L3, and transfer them to the testers 22a, 22b and 22c, respectively.

The testers 22a, 22b and 22c transfer the received testing results to the interface 3 through buses L4, L5 and L6, and then the testing results are input to the channels 15a, 15b and 15c through one bus L7.

The conventional test system is subject to having misconnected buses. FIG. 2 shows the test system, two buses of which are mis-connected. The buses L1 and L2 are inversely connected, i.e. the group of the testing results of the die 11a is output to the test module 21b and the group of the testing results of the die 11b is output to the test module 21a. Thus, the testing device 2 transferring the groups of the testing results of the dies 11a and lib through the buses L5 and L4, respectively. Consequently, the display 14 displays the testing results of the die 11a and 11b on the channels 15b and 15a respectively. An operator will be misled by the display 14 if unaware of the inversely connected buses L1 and L2.

SUMMARY OF THE INVENTION

The object of the present invention is to provide a multi-channel semiconductor test system capable of differentiating channels of a handler for corresponding dies during testing.

To achieve the above-mentioned object, the invention provides a multi-channel semiconductor test system comprising: a handler, a code generator, a testing device and a differentiator. The handler has a plurality of channels for testing a plurality of dies. The code generator generates a plurality of codes corresponding to the channels for the dies. The testing device tests the dies, derives and transfers a plurality of testing results of and together with the corresponding codes for the dies. The differentiator receives the testing results and the codes, and transfers the testing results to the handler through corresponding channels according to the codes.

The invention further provides a multi-channel semiconductor test system for testing dies on a wafer, comprising: a handler, a code generator, a testing device and a differentiator. The handler has a plurality of channels, accepts the wafer and displays a plurality of testing results from the channels. The code generator generates a plurality of codes corresponding to the channels for the dies on the wafer. The testing device tests the dies, derives and transfers the testing results of and together with the corresponding codes for the dies. The differentiator receives the testing results and the codes, and transfers the testing results to the handler through corresponding channels according to the codes.

In the present invention, a code generator and a differentiator are provided to generate codes transferred with testing results, and then to differentiate channels of a handler for corresponding dies under test according to the codes.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
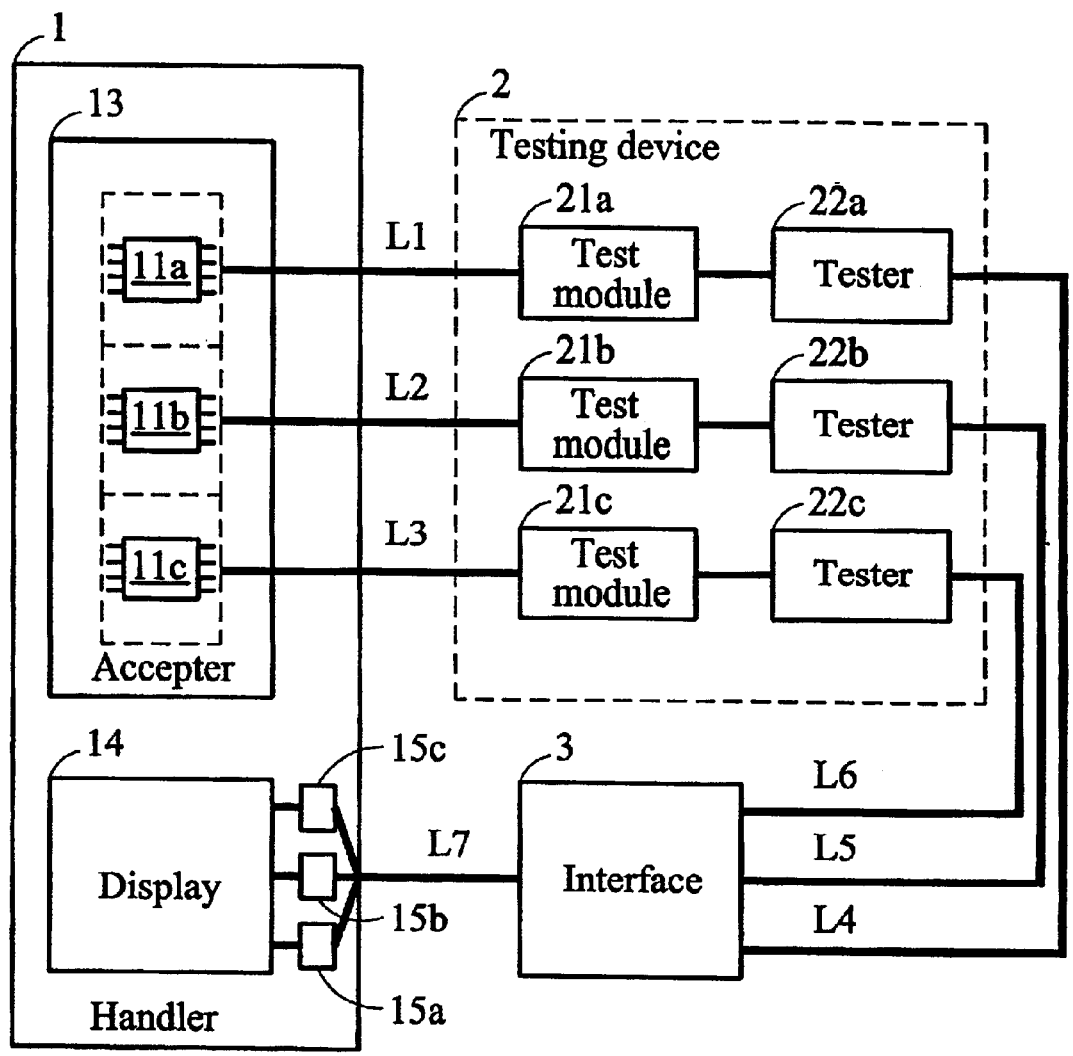
FIG. 1 is a block diagram of a conventional multi-channel semiconductor test system.
Figure 2:
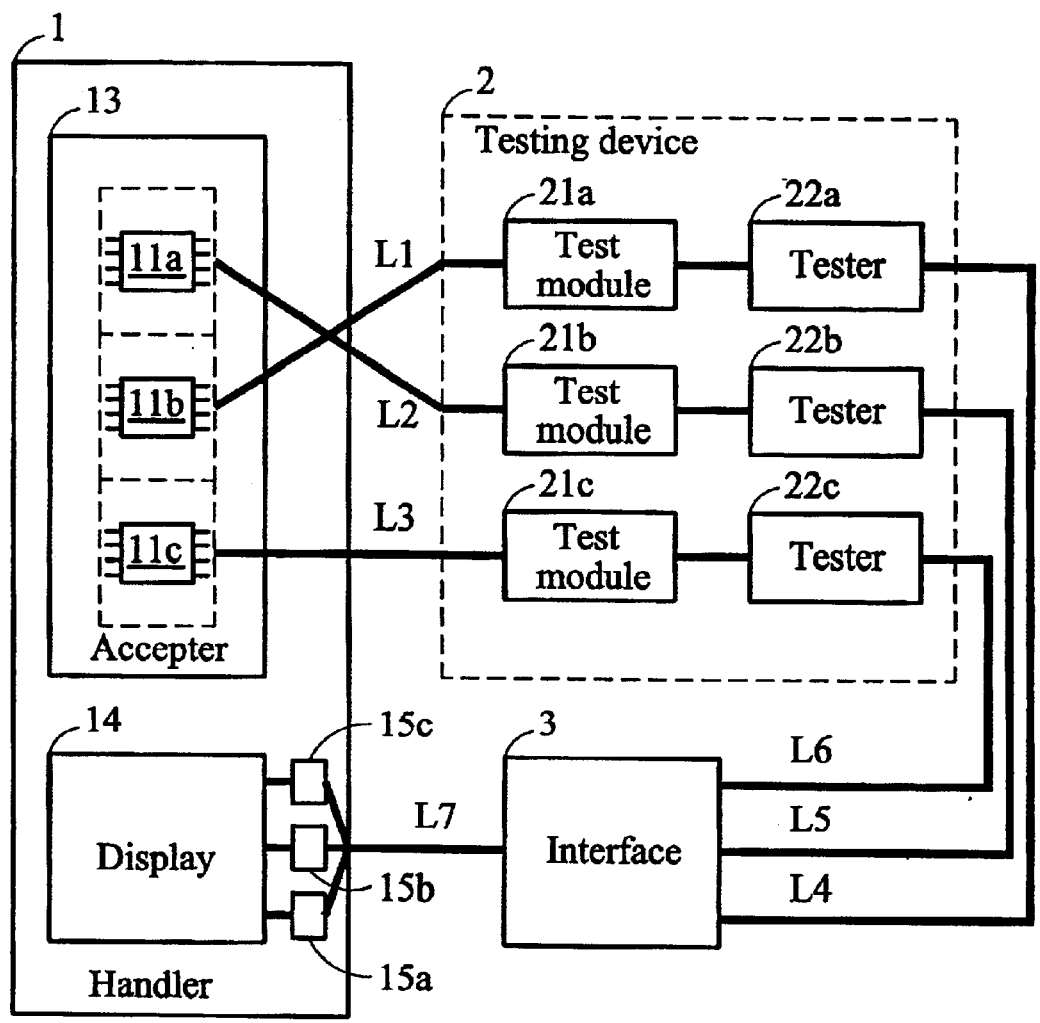
FIG. 2 is a block diagram of a conventional multi-channel semiconductor test system with two buses inversely connected.
Figure 3:
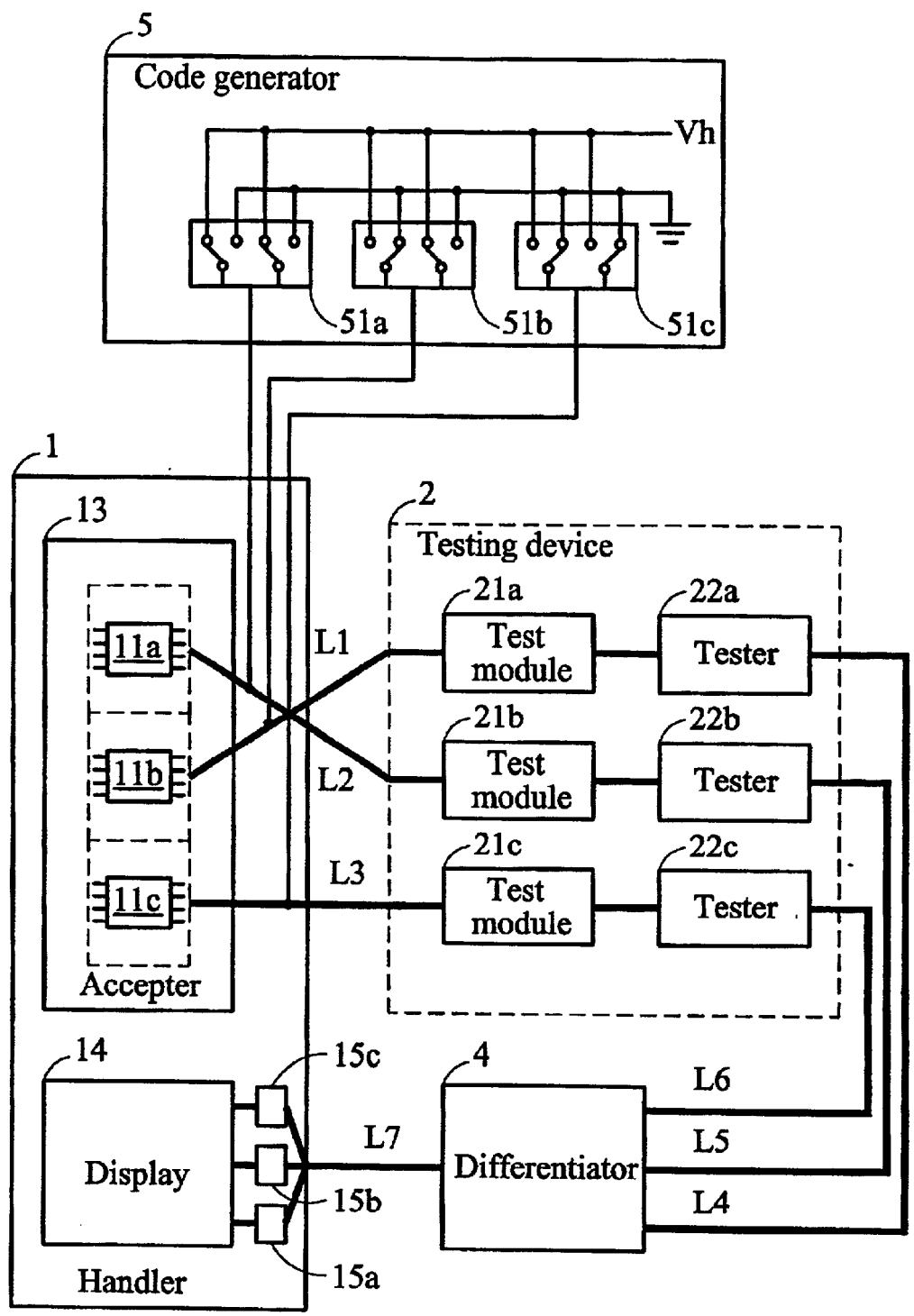
FIG. 3 is a block diagram of a multi-channel semiconductor test system according to an embodiment of the invention.

FIG. 3 is a block diagram of a multi-channel semiconductor test system according to an embodiment of the invention. The same elements in FIG. 1 and FIG. 3 are referred to by the same symbols and iterative explanations are omitted. The system comprises a handler 1, a testing device 2, a differentiator 4 and a code generator 5.

The difference between the test systems in FIG. 3 and FIG. 1 is that a code generator 5 is provided and a differentiator 4 substitutes for the interface 3 in the test system in FIG. 3.

The code generator 5 comprises three groups of switches 51a, 51b and 51c. Each of the switch groups 51a, 51b and 51c has two switches. Each switch in the switch groups switch to alternatively provide a high logic level (Vh) or a low logic level (ground), by which a bit of the codes is generated. The switch groups 51a, 51b and 51c output the codes (1,1), (0,1) and (0,0) onto the buses L1, L2 and L3.

The differentiator 4 functions as the interface 3 in FIG. 1 and additionally differentiates channels 15a, 15b and 15c of the handler 1 for the testing results of the corresponding dies 11a, 11b and 11c according to the codes (1,1),(0,1) and (0,0).

Figure 4:
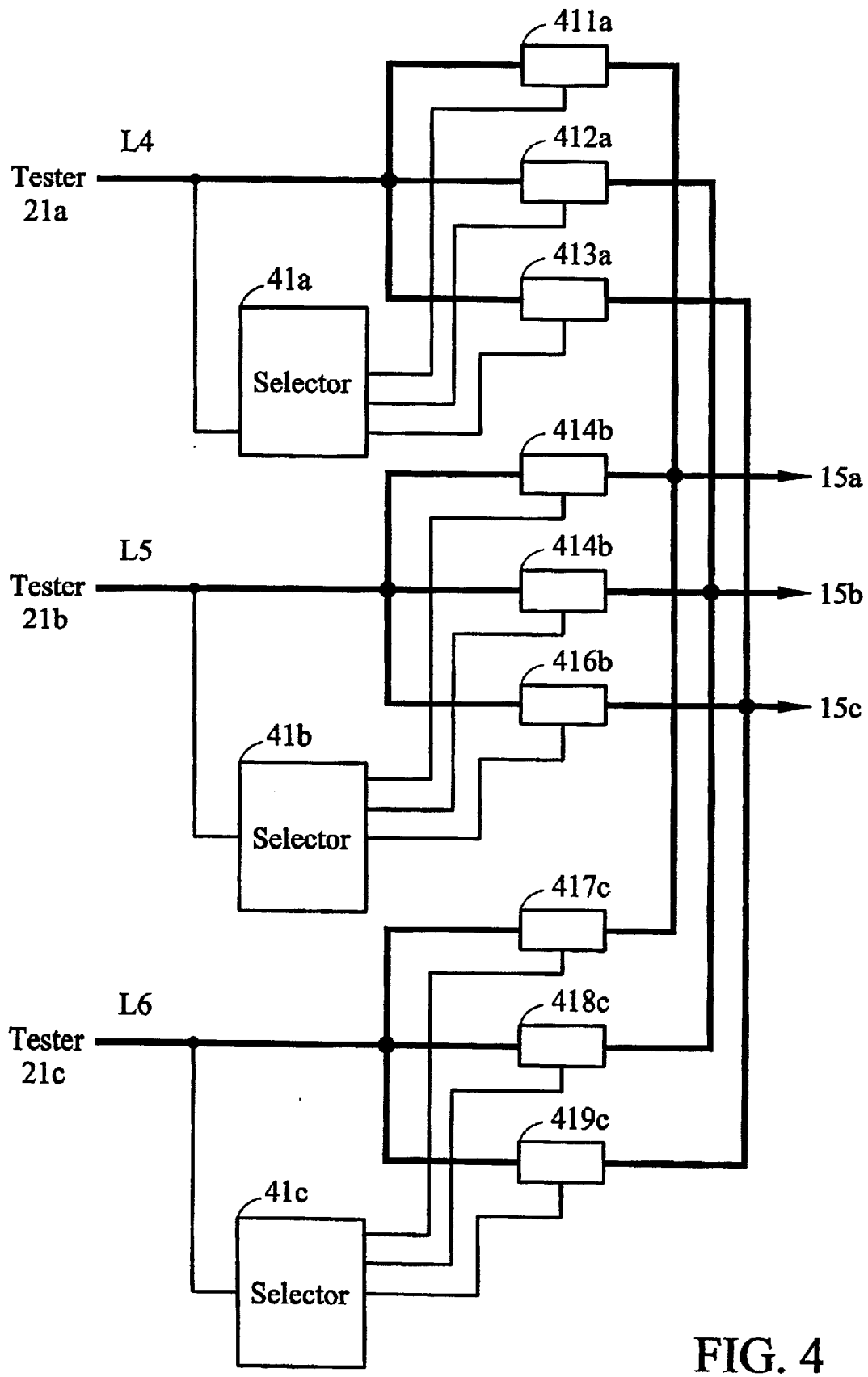
FIG. 4 is a block diagram of a differentiator of a multi-channel semiconductor test system according to an embodiment of the invention.

FIG. 4 is a block diagram of a differentiator of a multi-channel semiconductor test system according to an embodiment of the invention.

The differentiator 4 comprises three selectors 41a, 41b and 41c. The selectors 41a, 41b and 41c are connected to the switches 411a~413a, 414b~416b and 417c~419c and read one of the codes (1,1), (0,1) and (0,0) through the bus L4, L5 and L6, respectively. The switches 41a~413a, 414b~416b and 417c~419c are controlled by the selectors 41a, 41b and 41c respectively.

When the selector 41a, 41b or 41c reads the code (1,1), the corresponding switch 411a, 414b or 417c is turned on. When the selector 41a, 41b or 41c reads the code (0,1), the corresponding switch 412a, 415b or 418c is turned on. When the selector 41a, 41b or 41c reads the code (0,0), the corresponding switch 413a, 416b or 419c is turned on.

Please refer to FIG. 3 and FIG. 4. The bus L1 and L2 are inversely connected. The codes (1,1) and (0,1) generated by the code generator 5 are output to the testing device 2 through the buses L2 and L1, and then transferred to the differentiator 4 through the buses L5 and L4 together with the groups of the testing results of the dies 11a and 11b, respectively. The selector 41b and 41a of the differentiator 4 receive the codes (1,1) and (0,1) and accordingly turn on the switches 412a and 414b. Consequently, the groups of the testing results of the dies 11a and 11b are transferred onto the channels 15a and 15b of the handler 1 through the bus L7.

Alternatively, in the invention, the code generator can be disposed in the acceptor and the codes are output with the testing results from the handler to the testing device.

In conclusion, in the invention, a code generator and a differentiator are provided to generate codes transferred with testing results, and then to differentiate channels of a handler for corresponding dies under test according to the codes. An operator will not be misled by the display 14 even if he inversely connects the buses.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A multi-channel semiconductor test system comprising:
   a handler having a plurality of channels for testing a plurality of dies;
   a code generator generating a plurality of codes corresponding to the channels for the dies;
   a device testing the dies, deriving and transferring a plurality of testing results of and together with the corresponding codes for the dies; and
   a differentiator receiving the testing results and the codes, and transferring the testing results to the handler through corresponding channels according to the codes.

2. The system as claimed in claim 1 wherein the code generator comprises a group of switches each of which alternatively outputting a first or second logic level representing a bit of one of the codes.

3. The system as claimed in claim 1 wherein the differentiator comprising:
   a plurality of switches connected between the handler through the channels and the testing device for receiving the testing results; and
   a selector receiving one of the codes and accordingly turning on one of the switches, whereby the differentiator transfers one of the testing results to the handler through a corresponding channel.

4. The system as claimed in claim 1 wherein the testing device comprises a plurality of testers and test modules, and the testers control the test modules to test the dies.

5. A multi-channel semiconductor test system for testing dies on a wafer, comprising:
   a handler having a plurality of channels, accepting the wafer and displaying a plurality of testing results from the channels;
   a code generator generating a plurality of codes corresponding to the channels for the dies on the wafer;
   a testing device testing the dies, deriving and transferring the testing results of and together with the corresponding codes for the dies; and
   a differentiator receiving the testing results and the codes, and transferring the testing results to the handler through corresponding channels according to the codes.

6. The system as claimed in claim 5 wherein the code generator comprises a group of switches each of which alternatively outputs a first or second logic level representing a bit of one of the codes.

7. The system as claimed in claim 5 wherein the handler comprising:
   an acceptor accepting the wafer; and
   a display displaying the testing results from the channels.

8. The system as claimed in claim 7 wherein the code generator is disposed in the acceptor and the codes are output with the testing results from the handler to the testing device.

9. The system as claimed in claim 5 wherein the differentiator comprises:
   a plurality of switches connected between the handler through the channels and the testing device for receiving the testing results; and
   a selector receiving one of the codes and accordingly turning on one of the switches, whereby the differentiator transfers one of the testing results to the handler through a corresponding one of the channels.

10. The system as claimed in claim 1 wherein the testing device comprises a plurality of testers and test modules, and the testers control the test modules to test the dies.

* * * * *